(12) United States Patent
Yasuda

(10) Patent No.: US 7,812,358 B2
(45) Date of Patent: Oct. 12, 2010

(54) LIGHT-EMITTING DEVICE

(75) Inventor: Takaki Yasuda, Ichihara (JP)

(73) Assignee: Showa Denko K.K., Tokyo (JP)

( * ) Notice: Subject to any disclaimer, the term of this patent is extended or adjusted under 35 U.S.C. 154(b) by 160 days.

(21) Appl. No.: 12/066,591

(22) PCT Filed: Sep. 12, 2006

(86) PCT No.: PCT/JP2006/318462

§ 371 (c)(1),
(2), (4) Date: May 13, 2008

(87) PCT Pub. No.: WO2007/032520

PCT Pub. Date: Mar. 22, 2007

(65) Prior Publication Data

US 2009/0095972 A1    Apr. 16, 2009

Related U.S. Application Data

(60) Provisional application No. 60/718,323, filed on Sep. 20, 2005.

(30) Foreign Application Priority Data

Sep. 13, 2005   (JP)   ............... 2005-264754

(51) Int. Cl.
*H01L 27/15*   (2006.01)
*H01L 31/12*   (2006.01)
*H01L 33/00*   (2010.01)

(52) U.S. Cl. ............... 257/97; 257/98; 362/293

(58) Field of Classification Search ............ 257/97, 257/98, 100, E25.02; 362/293, 294
See application file for complete search history.

(56) References Cited

U.S. PATENT DOCUMENTS

| | | | |
|---|---|---|---|
| 6,350,953 B1 * | 2/2002 | Franzen | 174/528 |
| 6,914,267 B2 * | 7/2005 | Fukasawa et al. | 257/98 |
| 2003/0151044 A1 * | 8/2003 | Yamada | 257/14 |
| 2003/0189830 A1 * | 10/2003 | Sugimoto et al. | 362/294 |
| 2004/0065894 A1 | 4/2004 | Hashimoto et al. | |
| 2005/0084661 A1 * | 4/2005 | Hosoi et al. | 428/210 |

FOREIGN PATENT DOCUMENTS

| | | |
|---|---|---|
| JP | 62-97360 A | 5/1987 |
| JP | 62-227592 | 10/1987 |
| JP | 62-287633 | 12/1987 |
| JP | 4-79242 A | 3/1992 |
| JP | 4-354387 A | 12/1992 |
| JP | 7-66235 A | 3/1995 |
| JP | 10-93146 | 4/1998 |
| JP | 2003-152225 A | 5/2003 |
| JP | 2004-266124 A | 9/2004 |
| JP | 2005-39264 A | 2/2005 |
| JP | 2005243972 A * | 9/2005 |
| TW | 556364 | 10/2003 |

* cited by examiner

*Primary Examiner*—Phuc T Dang
(74) *Attorney, Agent, or Firm*—Sughrue Mion, PLLC

(57) ABSTRACT

A light-emitting device is provided in a light-emitting element with a bonding wire that is a fine metallic wire formed mainly of gold or copper and coated at least partly with a substance capable of heightening a reflection coefficient of a wavelength of light emitted from the light-emitting element.

7 Claims, 2 Drawing Sheets

LIGHT-EMITTING DEVICE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/718,323 filed Sep. 20, 2005 and Japanese Patent Application No. 2005-264754 filed Sep. 13, 2005 pursuant to 35 U.S.C. §111 (b).

TECHNICAL FIELD

This invention relates to a light-emitting device and particularly to a light-emitting device that enables a bonding wire used therein to induce enhanced reflection of light.

BACKGROUND ART

The trend of the LED toward higher output and higher efficiency has been adding to the range of applications to be found for the LED. In addition to the conventional use in colored indicators and outdoor large displays, the LED has been rapidly increasing the volume of use in the backlight source for a display of the mobile phone, the headlight, and the light source for illumination. For the sake of answering these needs for the LED, it has become necessary for the LED to attain further enhancement in output and efficiency.

The green to ultraviolet light-emitting diode 2 formed of a nitride compound semiconductor is generally known in two kinds, the type having the nitride compound semiconductor stacked on the front face of a sapphire substrate, forming a p-electrode and an n-electrode on the front side of the nitride compound semiconductor and connecting the electrodes with two Au wires 1 to a package lead 5 (refer to FIG. 1) and the type having the nitride compound semiconductor stacked on an SiC substrate, forming an n-electrode on the back side of the substrate and a p-electrode on the front side of the nitride compound semiconductor and connecting the back side of the substrate via one Au wire to the package lead. In the diagram, reference numeral 3 denotes a sealing resin and numeral 4 a molded body. In these configurations, the Au wires constitute such parts as cause loss of the light-emitting output because they absorb the light in the green to ultraviolet regions. As regards the problem of the absorption posed by the Au wire, a method which abates the loss by causing the resin mold wholly enclosing a light-emitting element to contain a fluorescent material capable of transforming the emitted light into a visible light having a longer wavelength than the wavelength of the emitted light, thereby enabling the light prior to impinging on the Au wire to be transformed into the light of the longer wavelength at which the Au wire exhibits a low light absorption factor has been disclosed (refer to Japanese Patent No. 2900928).

As a technique for coating a fine metallic wire for use in wire bonding, the coating of a gold wire with tin for the purpose of decreasing the cost of production, for example, has been disclosed (refer to JP-A SHO 62-227592). With the object of reconciling the reduction of cost and the enhancement of adhesive property, a bonding wire for use in connecting a semiconductor element, which wire is formed of a fine metallic wire of copper, aluminum or gold and has the surface of the fine wire coated with a metal having higher purity than the metal of the wire but equaling in kind thereto has been disclosed (refer to JP-A SHO 62-287633). These methods, however, are incapable of heightening the light reflection coefficient in the portion of the bonding wire.

This invention is aimed at providing a means for coping with the loss of absorption of light caused by a bonding wire of Au or Cu, i.e. a metal inducing absorption of light in the green to ultraviolet regions, and as well providing a light-emitting device which exhibits high output and high efficiency in consequence of the abatement of the loss. This invention is further aimed at promoting the addition to the output and efficiency of not only the green to ultraviolet monochromatic short-wavelength light-emitting element but also the white LED or any colored LED which has incorporated therein a wavelength-converting substance utilizing a green to ultraviolet short-wavelength light-emitting element as an excitation source.

This invention consists in accomplishing the objects mentioned above by coating the surface of an Au wire or a Cu wire serving as a bonding wire with a substance capable of heightening the coefficient of reflection of the light emitted from the LED and consequently imparting an enhanced light reflection coefficient to the bonding wire.

DISCLOSURE OF THE INVENTION

The first aspect of the invention provides a light-emitting device provided in a light-emitting element with a bonding wire that is a fine metallic wire formed mainly of gold or copper and coated at least partly with a substance capable of heightening a reflection coefficient of a wavelength of light emitted from the light-emitting element.

The second aspect of the invention provides the light-emitting device set forth in the first aspect, wherein the substance is a metal containing at least one member selected from the group consisting of Ag, Al and Rh.

The third aspect of the invention provides the light-emitting device set forth in the first or second aspect, wherein the fine metallic wire has a thickness in the range of 10 μm to 1000 μm.

The fourth aspect of the invention provides the light-emitting device set forth in any one of the first to third aspects, wherein the fine metallic wire is coated by any means selected from the group consisting of an electrolytic plating method, electroless plating method, vacuum deposition method, chemical vapor deposition (CVD) method, sputtering method, dissolving method, plasma spray method, supersonic method, metal powder-containing resin coating method, reducing method and ion plating method.

The fifth aspect of the invention provides the light-emitting device set forth in any one of the first to fourth aspects, wherein the substance has a thickness in the range of 1 nm to 10% of a diameter of the fine metallic wire.

The sixth aspect of the invention provides the light-emitting device set forth in any one of the first to fifth aspects, wherein part or most of a lead face for mounting the light-emitting element thereon is coated with at least one member selected from the group consisting of Ag, Al, Rh and a metal containing at least one of Ag, Al and Rh.

The seventh aspect of the invention provides the light-emitting device set forth in any one of the first to sixth aspects, which contains a fluorescent material capable of converting part or whole of the light emitted by the light-emitting element into a light of long wavelength.

This invention has realized the further addition to the output and the efficiency of the semiconductor light-emitting device by making it possible to suppress substantially completely the absorption of light by the Au or Cu wire. It has further realized the promotion of the addition to the output and the efficiency of not only the green to ultraviolet monochromatic short-wavelength light-emitting device but also the white LED and the colored LED which have incorporated therein a wavelength-converting substance utilizing a green to ultraviolet short-wavelength light-emitting element as an excitation source.

Because gold is less reactive against the other material, the void occurs easily between a gold wire and resin. By coating gold wire with other metal, the void can be reduced.

BEST MODE FOR CARRYING OUT THE INVENTION

Figure 1:
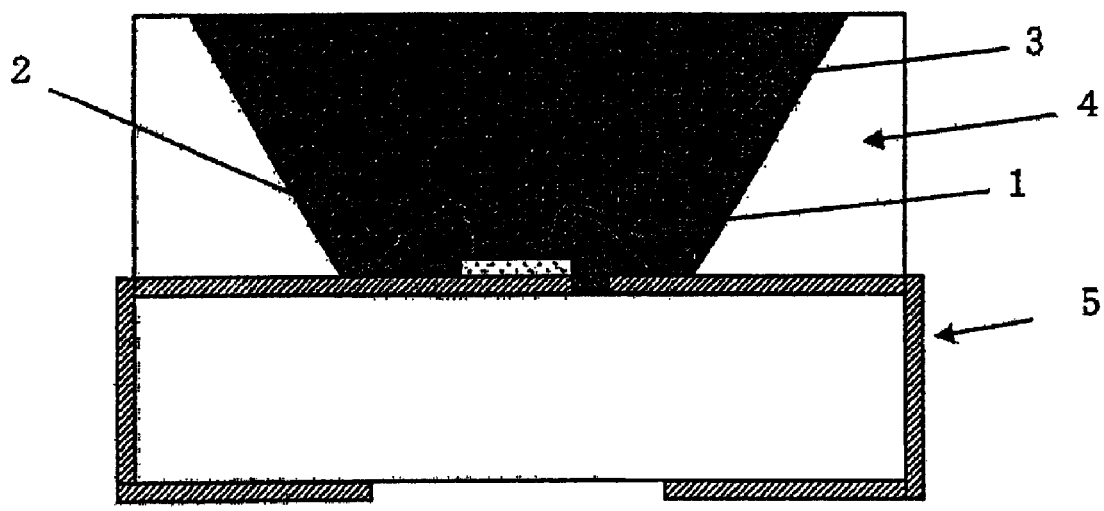
FIG. 1 is a schematic cross section illustrating the structure of a conventional surface mount LED.
Figure 2:
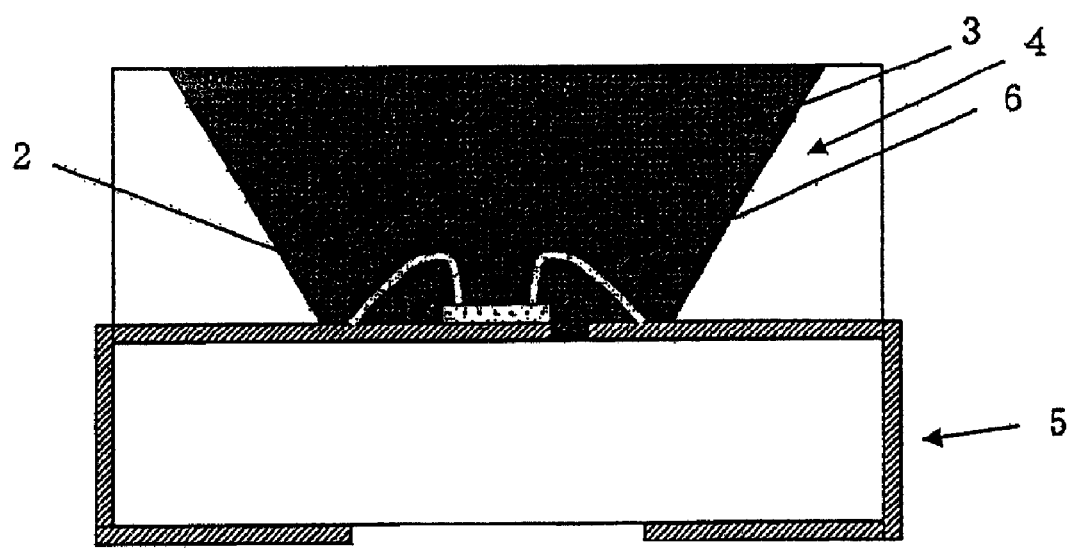
FIG. 2 is a schematic cross section illustrating the structure of a surface mount LED contemplated by this invention.

In FIG. 2, one example of the light-emitting device of this invention is illustrated in cross section.

In the diagram, reference numeral 6 represents an Au or Cu wire which is coated with a substance having a high light reflection coefficient. The coating that is made at least partly will suffice. Though the coating substance is only required to possess a higher light reflection coefficient than Au and Cu, it is preferred to be at least one member selected from the group consisting of Ag, Al, Rh and a metal containing at least one of Ag, Al and Rh from the standpoint of the property of reflection. When the coating substance contains such a metal, the content of the metal is preferred to be 50 mass % or more.

The thickness of the Au or Cu wire is preferred to be in the range of 10 μm to 1000 μm. The reason for this range is that the shell-type LED uses a fine metallic wire having a thickness of several tens of μm because the chip used therein has an approximate size of the square of 0.3 mm and the pad used therein for connection of the fine metallic wire has an approximate size of the square of 100 μm. The power module uses a fine metallic wire having a thickness of several hundreds of μm because the chip used therein has a size of several mm. The thickness of the coating layer is preferably in the range of 1 nm to 10% of the diameter of the fine metallic wire. The reason for this range is that the thickness falling short of 1 nm is too small to enhance the reflection coefficient and the thickness exceeding 10% of the diameter of the fine metallic wire results in impairing the adhesiveness during the course of wire bonding. The coating methods that are usable herein include the electrolytic plating method, the electroless plating method, the vacuum deposition method, chemical vapor deposition (CVD) method, sputtering method, dissolving method, plasma spray method, supersonic method, metal powder-containing resin coating method, reducing method and ion plating method, for example, and also include the spreading wire method after thick-coating on thick wire.

Referring to the drawings, reference numeral 2 represents a light-emitting element, numeral 3 a sealing resin, numeral 4 a molded body of resin, numeral 5 a lead and numeral 6 an Au wire coated with Ag.

This invention can be applied to all light-emitting devices, commencing with the Light-Emitting Diodes (LEDs) and the Vertical Cavity Surface Emitting Lasers (VCSELs), that invariably undergo wire bonding.

This invention is preferably applied to the light-emitting devices including the AlGaInN-based and other nitride compound semiconductor-based, the ZnO-based and other oxide compound semiconductor-based, the CdZnSSe-based and other selenide-based and the sulfide compound semiconductor-based light-emitting devices that invariably emit light in the ultraviolet to green short-wavelength regions in which the Au or Cu wire induces absorption conspicuously. This invention, far from posing a problem of any sort in being adapted to the light-emitting elements including the AlGaInP-based and other phosphide-based and the AlGaAs-based and other arsenide-based light-emitting elements that invariably emit light in green to red color, can be preferably applied to the red light-emitting element which is used in the so-called 3 in 1 package (the LED package having chips of three colors placed in one package) as disposed next a blue or green light-emitting element.

This invention is effectively used for the light-emitting elements of the type stacked on an electrically conductive substrate, provided on the epitaxial face side and the back side of the substrate with electrodes, and adapted to connect the epitaxial face side via one or a plurality of bonding wires and the substrate side through an electrically conductive adhesive agent to an outside lead 5 of the package.

In the light-emitting device of this invention, part or most of the lead fated to have a light-emitting element mounted thereon is preferably coated with at least one member selected from the group consisting of Ag, Al, Rh and a metal containing at least one of Ag, Al and Rh. When such a metal is contained, the content thereof is preferably 50 mass % or more. Consequently, the light reflection coefficient is heightened and the light-emitting output is augmented.

This invention is further used effectively where a light-emitting element is mounted on a sub-mount and the sub-mount is connected via one or more wires to the outside lead of a package.

Figure 3:
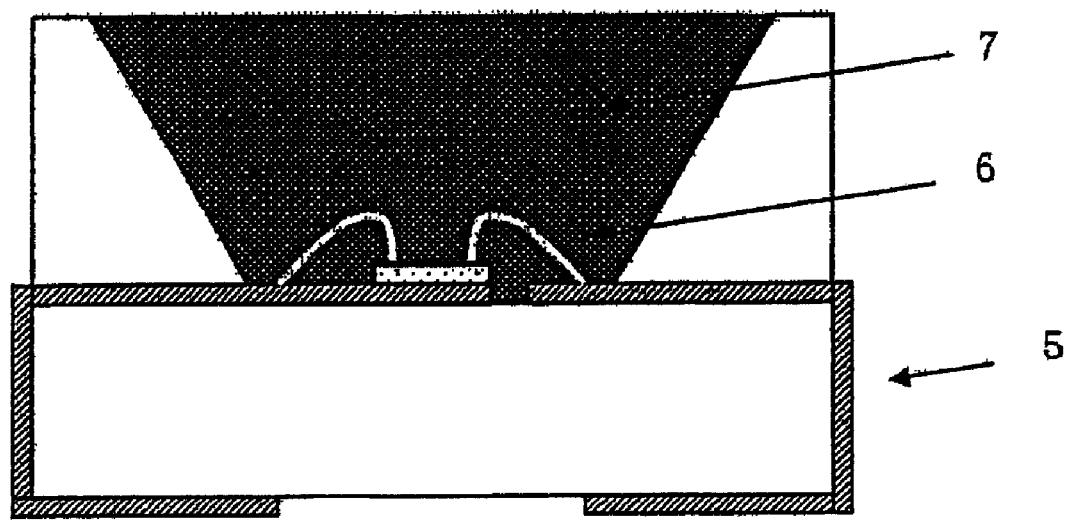
FIG. 3 is a schematic cross section illustrating the structure of a surface mount LED of this invention containing a fluorescent material.

The invention exhibits the effect thereof in light-emitting elements of all conceivable sizes and shapes including chip sizes of below the square of 0.2 mm to over the square of 1 mm and shapes of square, rectangle, circle and ellipse This invention may be combined with a fluorescent material. It exhibits the effect thereof copiously when it is applied to a white light-emitting element resulting from coating a blue light-emitting element with a yellow light-emitting fluorescent material or a white color light-emitting element resulting from coating an ultraviolet light-emitting element with a red, green or blue fluorescent material. The fluorescent material, in the place of the coating, may be deposited by being dispersed in a sealing resin. An example of this deposition is depicted in FIG. 3. In this diagram, reference numeral 7 represents a sealing resin containing a fluorescent material.

This invention can be applied to all packages and modules that utilize wire bonding such as, for example, shell-type packages (DOME), Surface Mount Diode (SMD) packages utilizing a PCB (Printed Circuit Board) substrate, SMDs utilizing top view type and side view type and other horizontal type leadframes, single packages including power LED packages, can type packages and other custom packages, Tip On Board (TOB) and Tip On Film (TOF).

This invention will be specifically described below based on an example. This invention is not limited to the example.

An example of the application of an Au wire coated with Ag for the purpose of enhancing reflection coefficient to a surface mount LED is illustrated in FIG. 2.

The LED chip consisted of an AlGaInN-based compound semiconductor crystal stacked on a sapphire substrate in such a structure as having an n-electrode and a p-electrode formed on an epitaxial film surface side. It measured the square of 0.35 mm in side and 0.1 mm in height. A p-type transparent electrode was formed of ITO (Indium Titanium Oxide) and an opaque pad for wire bonding was formed in part of the electrode. An n-electrode was formed on an n-type contact layer expressed by etching and a pad for wire bonding was formed likewise in the n-electrode. The outermost surfaces of the pads in the p-electrode and n-electrode were formed of Au.

The package of the surface mount LED measured 3.5 mm×2.8 mm in area and 1.8 mm in height. On a leadframe, a cup was formed of a white resin having a high reflection coefficient in such a structure that a pair of inner leads were expressed in the bottom face of the cup. The outermost surfaces of these inner leads were coated with Ag and the gap between the pair of leads was minimized in order that nearly the whole bottom face of the cup might constitute an Ag surface. The pair of inner leads was asymmetrically shaped and one of the inner leads was jutted out so as to occupy the vicinity of the axis of the package.

The LED chip was disposed using a thermosetting resin on the one inner lead jutted out in the vicinity of the axis. After the thermosetting resin was hardened in an oven, the LED chip and the inner leads of the surface mount LED package were connected with a wire bonder using a pair of bonding wires. The bonding wires that were used in this case resulted from coating the surface of an Au wire having a purity of 4N with Ag having a purity of 4N. The Au wire measured 25 µm in diameter and the Ag coating measured about 0.5 µm in thickness. The Ag coating on the Au wire was implemented by electroplating.

Since the amount of Ag was negligible as compared with that of Au, the ball shear strength on the chip that had undergone ball bonding showed no significant difference from that on the Au wire that had shunned the Ag coating. Neither did the bonding to the inner leads of the package show any significant difference from the Au wire that shunned the Ag coating.

Then, the interior of the cup was sealed with a thermosetting transparent silicon resin. By hardening the resin in an oven, a sample of the surface mount LED was completed.

Twenty (20) samples that had shunned Ag coating and as many samples that had undergone Ag coating were compared in terms of the output of light during the flow of a current of 20 mA. The former samples showed an average output of light of 15.3 mW and the latter samples an average output of light of 16.0 mW, indicating that the latter samples surpassed the former samples in output by about 4.6%. The average magnitudes of wavelength of emitted light were respectively 460.1 nm and 459.9 nm, denying attribution of the difference mentioned above to wavelength.

From the samples that had shunned Ag coating and the samples that had undergone Ag coating, specimens resulting from mixing a yellow fluorescent material with a silicon resin were prepared, respectively. The numbers of the resultant specimens were 20 each. The specimens involving no Ag coating were found to have average magnitudes of chromaticity coordinates (x, y)=(0.320, 0.326) and an average magnitude of luminous flux of 4.12 lm and the specimens involving Ag coating were found to have average magnitudes of chromaticity coordinates (x, y)=(0.321, 0.327) and an average magnitude of luminous flux of 4.28 lm, confirming an increase of total luminous flux by 3.9%. Incidentally, the magnitudes of luminous efficiency were respectively 58.9 lm/W and 61.1 lm/W, confirming abatement of loss of efficiency by Ag coating.

INDUSTRIAL APPLICABILITY

This invention is capable of providing a light source that suppresses the loss of output of a light-emitting element involving wire bonding with Au or Cu and augments luminous efficiency of the element. The light-emitting element contemplated by this invention contributes toward the saving of energy and abounds veritably in industrial availability.

The invention claimed is:

1. A light-emitting device provided in a light-emitting element with a bonding wire that is a fine metallic wire formed mainly of gold or copper and coated at least partly with a substance capable of heightening a reflection coefficient of a wavelength of light in a range from blue to ultraviolet regions.

2. A light-emitting device according to claim 1, wherein the substance is a metal containing at least one member selected from the group consisting of Ag, Al and Rh.

3. A light-emitting device according to claim 1, wherein the fine metallic wire has a diameter in a range of 10 µm to 1000 µm.

4. A light-emitting device according to claim 1, wherein the fine metallic wire is coated by any means selected from the group consisting of an electrolytic plating method, electroless plating method, vacuum deposition method, chemical vapor deposition method, sputtering method, dissolving method, plasma spray method, supersonic method, metal powder-containing resin coating method, reducing method and ion plating method.

5. A light-emitting device according to claim 4, wherein the fine metallic wire has a diameter in a range of 10 µm to 1000 µm, and the substance at least partly coating the fine metallic wire has a thickness in a range of 1 nm to 10% of a diameter of the fine metallic wire.

6. A light-emitting device according to claim 1, wherein part or most of a lead face for mounting the light-emitting element thereon is coated with at least one member selected from the group consisting of Ag, Al, Rh and a metal containing at least one of Ag, Al and Rh.

7. A light-emitting device according to claim 1, wherein the substance at least partly coating the bonding wire comprises a fluorescent material capable of converting part or whole of the light emitted by the light-emitting element into a light of long wavelength.

* * * * *